United States Patent
Hamasaki

(10) Patent No.: US 11,835,867 B2
(45) Date of Patent: Dec. 5, 2023

(54) MEASURING DEVICE AND MEASURING METHOD

(71) Applicant: KIOXIA CORPORATION, Tokyo (JP)

(72) Inventor: Masakazu Hamasaki, Mie Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/894,783

(22) Filed: Aug. 24, 2022

(65) Prior Publication Data

US 2023/0296991 A1 Sep. 21, 2023

(30) Foreign Application Priority Data

Mar. 18, 2022 (JP) ................................. 2022-043802

(51) Int. Cl.
*G03F 9/00* (2006.01)
*G03F 7/00* (2006.01)

(52) U.S. Cl.
CPC ........ *G03F 7/70683* (2013.01); *G03F 9/7046* (2013.01)

(58) Field of Classification Search
CPC .............................. G03F 7/70683; G03F 9/7046
See application file for complete search history.

(56) References Cited

U.S. PATENT DOCUMENTS

| 7,130,029 B2 * | 10/2006 | Wack .................. G03F 7/70658 356/73 |
| 9,939,741 B2 | 4/2018 | Maeda |
| 2010/0220339 A1 * | 9/2010 | Rinn ...................... G01B 11/03 702/179 |
| 2013/0321811 A1 | 12/2013 | Maeda et al. |
| 2017/0167862 A1 | 6/2017 | Dziura et al. |

FOREIGN PATENT DOCUMENTS

| JP | 2013-258377 A | 12/2013 |
| JP | 5743958 B2 | 7/2015 |
| JP | 2017-215617 A | 12/2017 |
| JP | 6366261 B2 | 8/2018 |
| JP | 2019-505766 A | 2/2019 |

\* cited by examiner

*Primary Examiner* — Mesfin T Asfaw
(74) *Attorney, Agent, or Firm* — Foley & Lardner LLP

(57) ABSTRACT

According to one embodiment, a measuring device includes a support body, a first light source, a second light source, a first sensor, and a second sensor. The support body is configured to support an end portion of a measurement target. The first light source is disposed on a front surface side of the support body. The second light source is disposed on a rear surface side of the support body. An optical axis of the second light source coincides with an optical axis of the first light source. The first sensor is configured to acquire an image of a mark in the measurement target in accordance with light from the first light source. The second sensor is configured to acquire an image of the mark in the measurement target in accordance with light from the second light source.

19 Claims, 10 Drawing Sheets

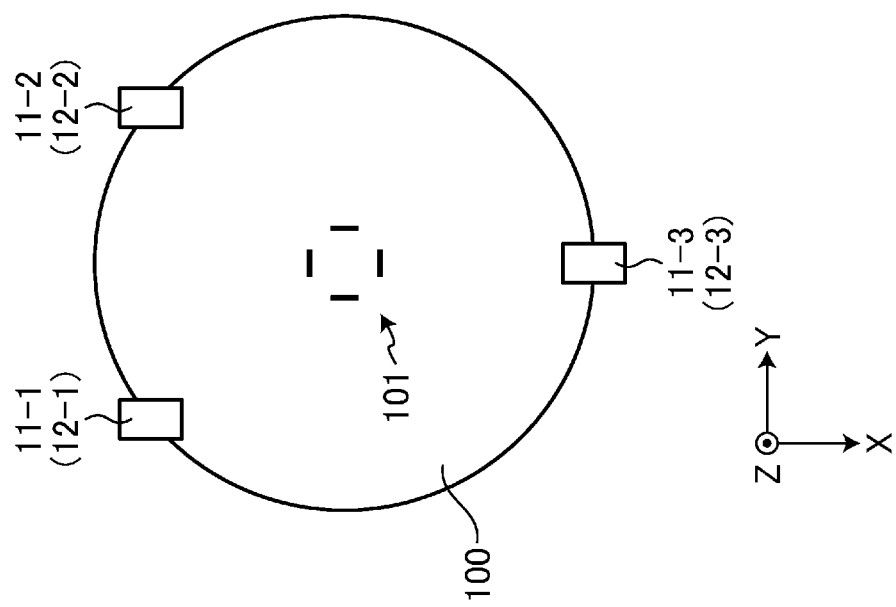
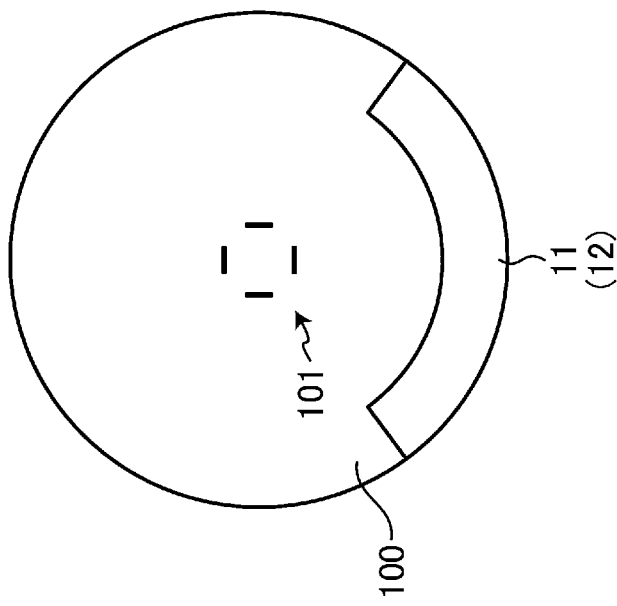
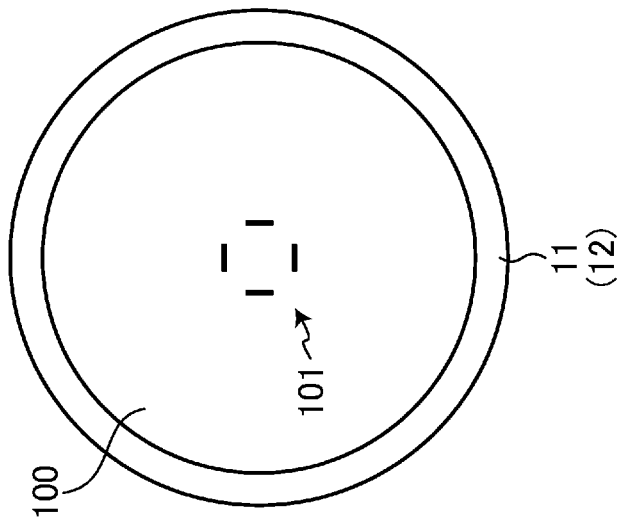

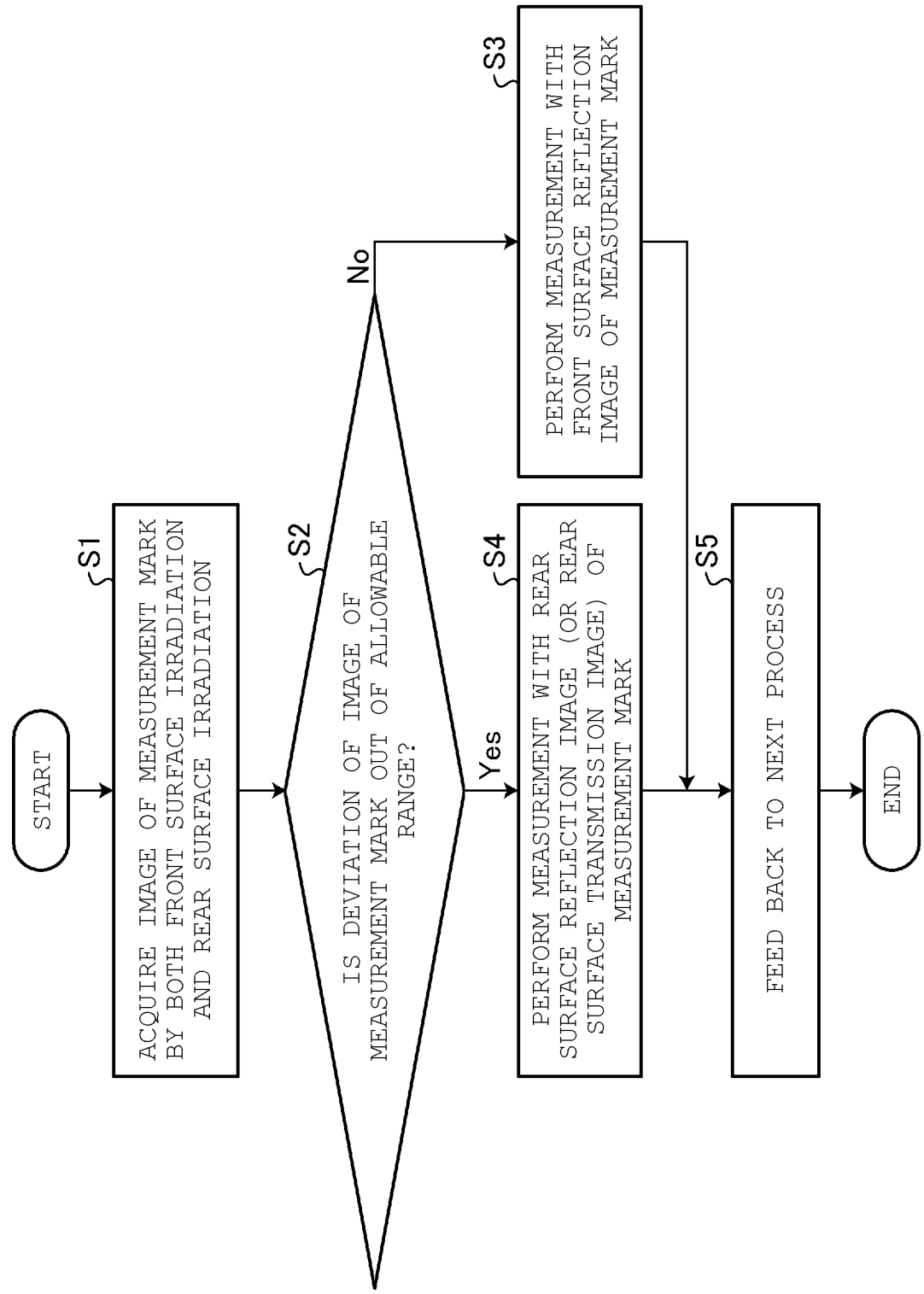

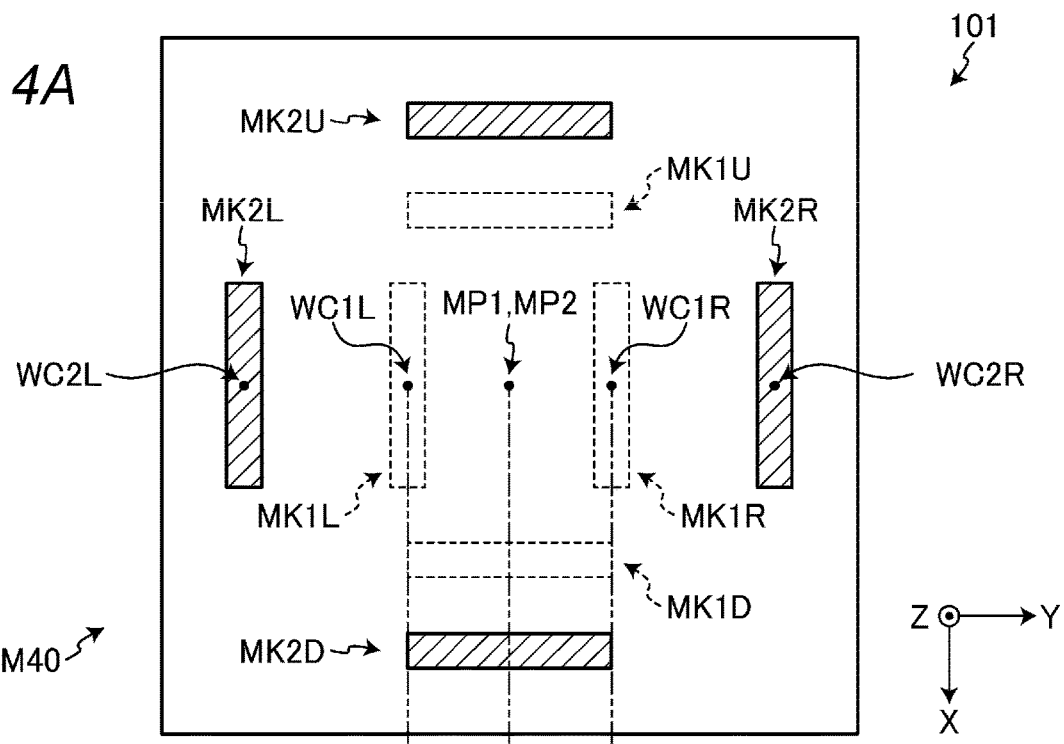
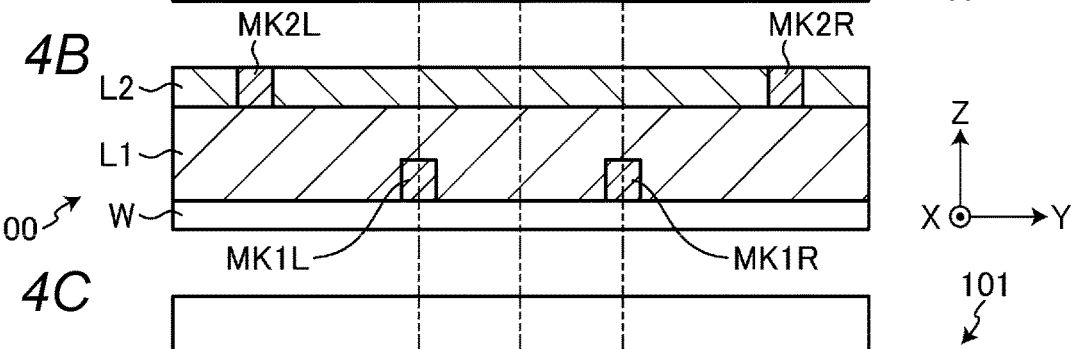
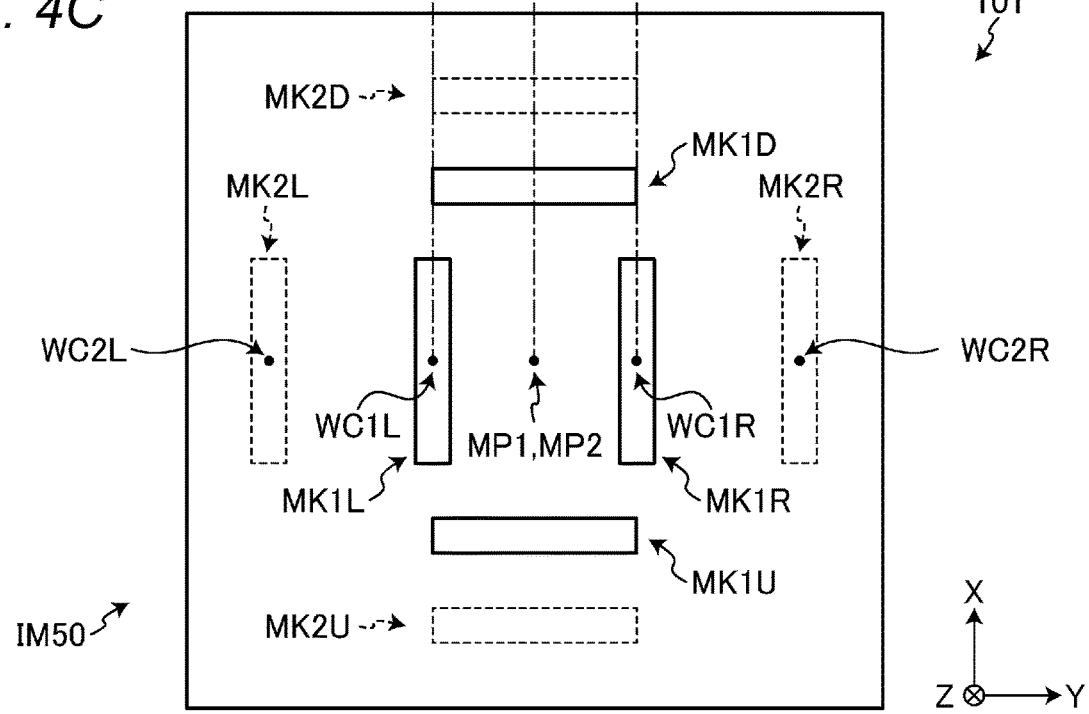

MEASURING DEVICE AND MEASURING METHOD

CROSS-REFERENCE TO RELATED APPLICATION(S)

This application is based upon and claims the benefit of priority from Japanese Patent Application No. 2022-043802, filed Mar. 18, 2022, the entire contents of which are incorporated herein by reference.

FIELD

Embodiments described herein relate generally to a measuring device and a measuring method.

BACKGROUND

A measuring device may measure a measurement mark disposed on a front surface of a plate-shaped measurement target. In this measurement, it is desired to measure the measurement mark with high accuracy.

DESCRIPTION OF THE DRAWINGS

FIGS. 2A to 2C are plan views illustrating configurations of a support body according to the embodiment.

FIG. 3 is a flowchart illustrating an operation of the measuring device according to the embodiment.

FIGS. 4A to 4C are plan and cross-sectional views illustrating a measurement mark measurement result according to the embodiment.

DETAILED DESCRIPTION

Embodiments provide a measuring device and a measuring method enabling a measurement mark to be measured with high accuracy.

In general, according to one embodiment, a measuring device includes a support body, a first light source, a second light source, a first sensor, and a second sensor. The support body is capable of supporting an end portion of a measurement target. The first light source is disposed on a front surface side of the support body. The second light source is disposed on a rear surface side of the support body. An optical axis of the second light source coincides with an optical axis of the first light source. The first sensor is capable of sensing light from the first light source. The second sensor is capable of sensing light from the second light source.

Hereinafter, a measuring device according to an embodiment will be described in detail with reference to the accompanying drawings. It is noted that the present disclosure is not limited to this embodiment.

Embodiment

The measuring device according to the embodiment measures a measurement mark disposed on a front surface of a plate-shaped measurement target. The plate-shaped measurement target may be, for example, a single substrate or a stacked substrate in which an upper substrate and a lower substrate are stacked. When the measurement target is a single substrate, the measurement mark may be a misalignment mark used in measuring a misalignment between an upper layer and a lower layer formed in the substrate. The measurement mark is formed in a vicinity of a front surface of the substrate. When the measurement target is the stacked substrate, the measurement mark may be a reference mark used in aligning the upper substrate and the lower substrate. The measurement mark may be formed in a vicinity of each of a front surface of the upper substrate and a front surface of the lower substrate. In the following description, a case where the measurement target is a single substrate will be exemplified.

Figure 1:
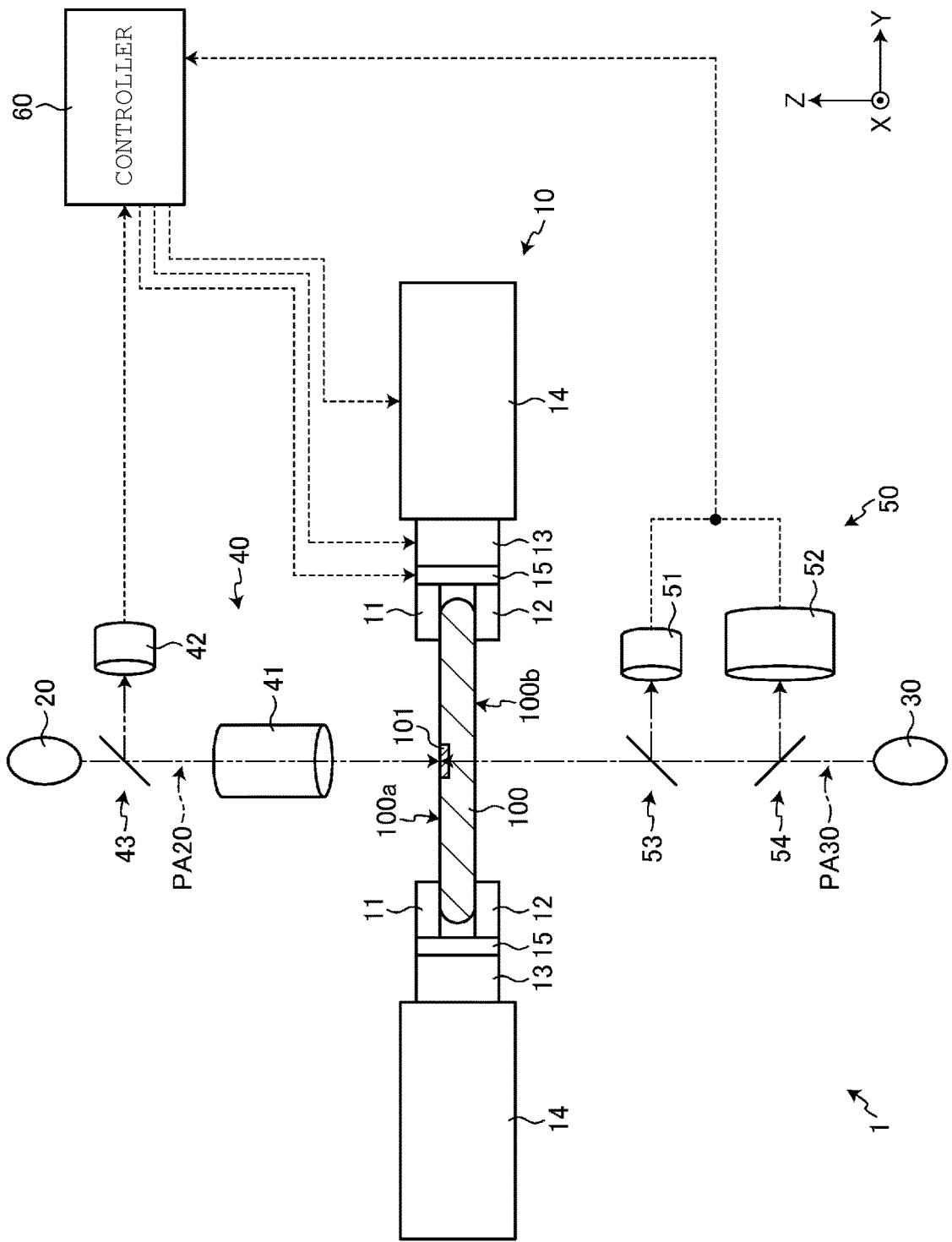
FIG. 1 is a diagram illustrating a configuration of a measuring device according to an embodiment.

A measuring device 1 may be configured as illustrated in FIG. 1. FIG. 1 is a diagram illustrating a configuration of the measuring device 1. The measuring device 1 includes a support body 10, a light source 20, a light source 30, a sensor 40, a sensor 50, and a controller 60. An optical axis PA20 of the light source 20 and an optical axis PA30 of the light source 30 substantially coincide with each other. In the following description, a direction along the optical axis PA20 and the optical axis PA30 will be referred to as a Z direction, and two directions orthogonal to each other in a plane perpendicular to the Z direction will be referred to as an X direction and a Y direction. For example, the Z direction may be along a vertical direction, and the XY directions may be along a horizontal direction.

A measurement target 100 may be a plate-shaped member and is, for example, a substrate. The measurement target 100 has a measurement mark 101 disposed in a vicinity of a front surface 100a. The measuring device 1 measures the measurement mark 101.

The support body 10 is capable of supporting an end portion of the measurement target 100. The support body 10 is capable of supporting the measurement target 100 in a posture in which the front surface 100a is along the horizontal direction. As a result, the measurement target 100 can be held in a state where light can be easily transmitted at a part on an inner side from the end portion of the measurement target 100. The measurement target 100 may be plate-shaped and is, for example, a substrate. The support body 10 may support the measurement target 100 by sandwiching the front surface 100a and a rear surface 100b in a vicinity of the end portion of the measurement target 100.

The support body 10 has grip portions 11 and 12, an interval adjusting unit 15, a rotational driving unit 13, and a planar driving unit 14.

The grip portion 11 grips the front surface 100a in the vicinity of the end portion of the measurement target 100. An end portion of the grip portion 11 on an outer side in the XY directions is connected to the rotational driving unit 13, and the grip portion 11 is connected to the planar driving unit 14 via the rotational driving unit 13.

The grip portion 12 grips the rear surface 100b in the vicinity of the end portion of the measurement target 100. An end portion of the grip portion 12 on the outer side in the XY directions is connected to the rotational driving unit 13, and the grip portion 12 is connected to the planar driving unit 14 via the rotational driving unit 13.

The interval adjusting unit 15 is capable of adjusting a Z-direction interval between the grip portion 11 and the grip portion 12 according to a control of the controller 60. For example, when the measurement target 100 is gripped, the interval adjusting unit 15 widens the Z-direction interval between the grip portion 11 and the grip portion 12 and causes the end portion of the measurement target 100 to be inserted between the grip portion 11 and the grip portion 12 according to the control of the controller 60. In a state where the end portion of the measurement target 100 is inserted between the grip portion 11 and the grip portion 12, the interval adjusting unit 15 narrows the Z-direction interval between the grip portion 11 and the grip portion 12 and causes the grip portion 11 and the grip portion 12 to grip the end portion of the measurement target 100 according to the control of the controller 60.

The rotational driving unit 13 is capable of rotationally driving the grip portions 11 and 12 around a Z axis according to the control of the controller 60. In a state where the end portion of the measurement target 100 is gripped by the grip portions 11 and 12, the rotational driving unit 13 rotates the measurement target 100 (for example, substrate) around the Z axis by rotationally driving the grip portions 11 and 12 around the Z axis according to the control of the controller 60. An end portion of the rotational driving unit 13 on the outer side in the XY directions may be connected to the planar driving unit 14 via a structure slidable around the Z axis.

The planar driving unit 14 is capable of planarly driving the grip portions 11 and 12 in the XY directions according to the control of the controller 60. In a state where the end portion of the measurement target 100 is gripped by the grip portions 11 and 12, the planar driving unit 14 planarly moves the measurement target 100 (for example, substrate) in the XY directions by planarly driving the grip portions 11 and 12 in the XY directions according to the control of the controller 60.

As illustrated in FIGS. 2A to 2C, the support body 10 has any planar configuration capable of supporting the end portion of the measurement target 100. FIGS. 2A to 2C are XY plan views illustrating configurations of the support body 10. For simplification, the interval adjusting unit 15, the rotational driving unit 13, and the planar driving unit 14 are not illustrated in FIGS. 2A to 2C.

For example, as illustrated in FIG. 2A, the grip portions 11 and 12 may be configured in an annular shape in an XY plan view. In this case, the grip portions 11 and 12 grip the end portion of the measurement target 100 over an entire circumference, and thus the measurement target 100 can be stably gripped. Alternatively, as illustrated in FIG. 2B, the grip portions 11 and 12 may be configured in an arc shape in an XY plan view. In this case, the grip portions 11 and 12 are capable of gripping the measurement target 100 in a planar posture defined by the arc shape, and thus the measurement target 100 can be stably gripped. Alternatively, as illustrated in FIG. 2C, the grip portions 11 and 12 may be configured with a plurality of members (e.g., 11-1, 11-2, 11-3, 12-1, 12-2, 12-3). The plurality of members are positioned at the vertices of a polygon inscribed in a planar shape of the measurement target 100 in an XY plan view. In this case, the grip portions 11 and 12 are capable of gripping the measurement target 100 in a planar posture defined by the polygon, and thus the measurement target 100 can be stably gripped.

The light source 20 illustrated in FIG. 1 generates light and emits the light in a −Z direction along the optical axis PA20. The light of the light source 20 can be reflected by the front surface 100a of the measurement target 100. For example, when the measurement target 100 is formed of a semiconductor (for example, silicon), the light of the light source 20 may be visible light or broad light with a wavelength band of 300 to 900 nm. The light source 20 is any light source capable of generating visible light and may be a xenon lamp, a light emission diode (LED), a laser diode (LD), or the like.

The light source 30 generates light and emits the light in a +Z direction along the optical axis PA30. The light emitted by the light source 30 is transmissive with respect to the measurement target 100. For example, when the measurement target 100 is formed of a semiconductor (for example, silicon), the light of the light source 30 may be infrared light or light with a wavelength band of 1,000 nm or more. The light source 30 is any light source capable of generating infrared light and may be an infrared lamp, an infrared light emission diode (LED), an infrared laser diode (LD), or the like.

The optical axis PA20 of the light source 20 and the optical axis PA30 of the light source 30, both of which are along the Z direction, substantially coincide with each other and are on substantially the same straight line. As a result, optical axis alignment is easy when the same mark is to be measured with the light of the light source 20 and the light of the light source 30.

The sensor 40 is capable of acquiring an image of a predetermined mark in the measurement target 100 in accordance with the light from the light source 20. The sensor 40 senses the measurement mark 101 disposed on the front surface 100a of the measurement target 100 (for example, substrate). The measurement mark 101 may be a misalignment mark for inter-layer misalignment measurement. The sensor 40 is disposed on a front surface side of the support body 10 (+Z side). The sensor 40 is capable of acquiring a front surface reflection image of the measurement mark 101 in the measurement target 100 from the +Z side.

The sensor 40 has an optical system 41, a half mirror 43, and an image detector 42. The optical system 41 is disposed on the optical axis PA30. The half mirror 43 is disposed at a position between the optical system 41 and the light source 20 on the optical axis PA30. The optical system 41 guides light incident from the light source 20 through the half mirror 43 to the measurement mark 101. A part of the reflected light reflected by the measurement mark 101 is reflected in the Y direction by the half mirror 43 and incident on the image detector 42. The image detector 42 acquires an image signal of the front surface reflection image of the measurement mark 101 according to the incident light and supplies the image signal to the controller 60. As a result, the controller 60 generates image data of the front surface reflection image of the measurement mark 101 according to the image signal.

The sensor 50 is capable of acquiring the image of the predetermined mark in the measurement target 100 in accordance with the light from the light source 20. The sensor 50 senses the measurement mark 101 disposed on the front surface 100a of the measurement target 100 (for example, substrate). The measurement mark 101 may be the same as the measurement mark 101 of which image is acquired by the sensor 40. The measurement mark 101 may be the misalignment mark for inter-layer misalignment measurement. The sensor 50 is disposed on a rear surface side of the support body 10 (−Z side). The sensor 50 is capable of acquiring a rear surface reflection image of the measurement mark 101 in the measurement target 100 from the −Z side.

The sensor 50 has a focus sensor 51, an imaging sensor 52, a half mirror 53, and a half mirror 54. The half mirror 54 is disposed on the optical axis PA30. The half mirror 53 is disposed at a position between the half mirror 54 and the light source 30 on the optical axis PA30. The light from the light source 30 is transmitted through each of the half mirror 54 and the half mirror 53, further transmitted through the measurement target 100, and guided to the measurement mark 101 on a front surface 100a side.

A part of the reflected light reflected by the measurement mark 101 is reflected in the Y direction by the half mirror 53 and incident on the focus sensor 51, and the other part is transmitted through the half mirror 53. The focus sensor 51 is coupled to the imaging sensor 52. The focus sensor 51 performs focus measurement according to the incident light, obtains a defocus amount of the imaging sensor 52, and supplies the defocus amount to the controller 60. The controller 60 moves the imaging sensor 52 in the Y direction according to the defocus amount and adjusts the focus of the imaging sensor 52.

A part of the reflected light transmitted through the half mirror 53 is reflected in the Y direction by the half mirror 54 and incident on the imaging sensor 52. The imaging sensor 52 acquires an image signal of the rear surface reflection image of the measurement mark 101 and supplies the image signal to the controller 60. As a result, the controller 60 generates image data of the rear surface reflection image of the measurement mark 101 according to the image signal.

The controller 60 comprehensively controls the measuring device 1. For example, the controller 60 may control the sensor 40 and the sensor 50 such that an operation of the sensor 40 sensing the measurement mark 101 and an operation of the sensor 50 sensing the measurement mark 101 are performed in parallel. The controller 60 receives the image data of the front surface reflection image of the measurement mark 101 from the sensor 40 as a sensing result and receives the image data of the rear surface reflection image of the measurement mark 101 from the sensor 50 as a sensing result. The controller 60 compares the sensing result of the sensor 40 with the sensing result of the sensor 50. The controller 60 may compare the image data of the front surface reflection image of the measurement mark 101 with the image data of the rear surface reflection image of the measurement mark 101 and obtain a degree of coincidence between the two pieces of image data as a comparison result. The controller 60 determines, according to the comparison result, which of the sensing result of the sensor 40 and the sensing result of the sensor 50 is to be used in performing measurement. The controller 60 performs measurement using the sensing result of the sensor 40 or the sensing result of the sensor 50 according to the determination result.

For example, the measuring device 1 operates as illustrated in FIG. 3. FIG. 3 is a flowchart illustrating an operation of the measuring device 1.

The measuring device 1 acquires an image of the measurement mark 101 by both a front surface irradiation and a rear surface irradiation (S1). In other words, the controller 60 controls the support body 10 and causes the grip portion 11 and the grip portion 12 to grip the end portion of the measurement target 100. The controller 60 controls the support body 10 to move the measurement target 100 in the XY directions and a rotation direction around the Z axis via the grip portion 11 and the grip portion 12 and align the optical axis PA20 of the light source 20 with the measurement mark 101 in the measurement target 100. Since the optical axis PA20 of the light source 20 and the optical axis PA30 of the light source 30 coincide with each other, axial alignment is easy between the optical axes PA20 and PA30 and the measurement target 100. By aligning the optical axis PA20 of the light source 20 with the measurement mark 101 in the measurement target 100, the optical axis PA30 of the light source 30 can be aligned with the measurement mark 101 in the measurement target 100. In this state, the controller 60 causes the measurement mark 101 to be irradiated with light (for example, visible light) from the light source 20 from the +Z side, causes the sensor 40 to sense the front surface reflection image reflected by the measurement mark 101, and acquires the image data of the front surface reflection image of the measurement mark 101. The controller 60 causes the measurement mark 101 to be irradiated with light (for example, infrared light) from the light source 30 from the −Z side, causes the sensor 40 to sense the rear surface reflection image reflected by the measurement mark 101, and acquires the image data of the rear surface reflection image of the measurement mark 101.

The measuring device 1 determines whether a deviation between a front surface reflection image of the measurement mark and a rear surface reflection image of the measurement mark is out of an allowable range (S2). In other words, the controller 60 compares the image data of the front surface reflection image of the measurement mark 101 with the image data of the rear surface reflection image of the measurement mark 101. On condition that the degree of coincidence between the image data of the front surface reflection image of the measurement mark 101 and the image data of the rear surface reflection image of the measurement mark 101 is higher than a threshold value, the controller 60 is capable of determining that the deviation between the front surface reflection image of the measurement mark and the rear surface reflection image of the measurement mark is in the allowable range. On condition that the degree of coincidence between the image data of the front surface reflection image of the measurement mark 101 and the image data of the rear surface reflection image of the measurement mark 101 is equal to or lower than the threshold value, the controller 60 is capable of determining that the deviation between the front surface reflection image of the measurement mark and the rear surface reflection image of the measurement mark is out of the allowable range.

For example, as illustrated in FIG. 4B, it is assumed that a layer L1 including a superposition mark MK1 and a predetermined pattern PT1 (not illustrated) is formed on a substrate W and a layer L2 including a superposition mark MK2 and a predetermined pattern PT2 (not illustrated) is formed on the layer L1. The superposition mark MK1 includes superposition marks MK1L, MK1R, MK2L, and MK2R in the Y direction and superposition marks MK1U, MK1D, MK2U, and MK2D in the X direction. The superposition marks MK1L, MK1R, MK2L, and MK2R in the Y direction will be exemplified in the following description.

The superposition marks MK1L, MK1R, MK2L, and MK2R are uniform in a front surface shape on the +Z side and a front surface shape on the −Z side.

In this state, the measuring device 1 acquires images of the superposition marks MK1L, MK1R, MK2L, and MK2R. The controller 60 causes the sensor 40 to sense front surface reflection images of the superposition marks MK1L, MK1R, MK2L, and MK2R by the light of the light source 20 to acquire image data IM40 of the front surface reflection images of the superposition marks MK1L, MK1R, MK2L, and MK2R as illustrated in FIG. 4. The controller 60 causes the sensor 50 to sense rear surface reflection images of the superposition marks MK1L, MK1R, MK2L, and MK2R by the light of the light source 30 to acquire image data IM50 of the rear surface reflection images of the superposition marks MK1L, MK1R, MK2L, and MK2R as illustrated in FIG. 4C.

The controller 60 compares the image data IM40 of the front surface reflection image with the image data IM50 of the rear surface reflection image. As for the image data illustrated in FIGS. 4A to 4C, the controller 60 determines that a degree of coincidence between the image data IM40 of the front surface reflection image and the image data IM50 of the rear surface reflection image is higher than a threshold value and the deviation between the front surface reflection image of the measurement mark and the rear surface reflection image of the measurement mark is in the allowable range.

Here, the measurement mark 101 is formed through processes such as exposure, development, and etching in the processing of the measurement target 100 (for example, manufacturing of a semiconductor device on a semiconductor substrate). At this time, even if the exposure and the development are appropriately performed and the measurement mark 101 is formed at an appropriate position in the measurement target 100 (for example, substrate), if an amount of processing by etching fluctuates in a planar direction, a front surface-side shape of the measurement mark 101 may be distorted as compared with a rear surface-side shape. Alternatively, the front surface-side shape of the measurement mark 101 may be distorted as compared with the rear surface-side shape by, for example, film stress attributable to etching of another pattern in the same layer acting in the planar direction in the film. When the front surface-side shape of the measurement mark 101 is distorted as compared with the rear surface-side shape, an error (measurement deception) in a measured value obtained from the front surface reflection image of the measurement mark 101 may occur when measurement is performed using the front surface reflection image of the measurement mark 101.

Figure 5A:
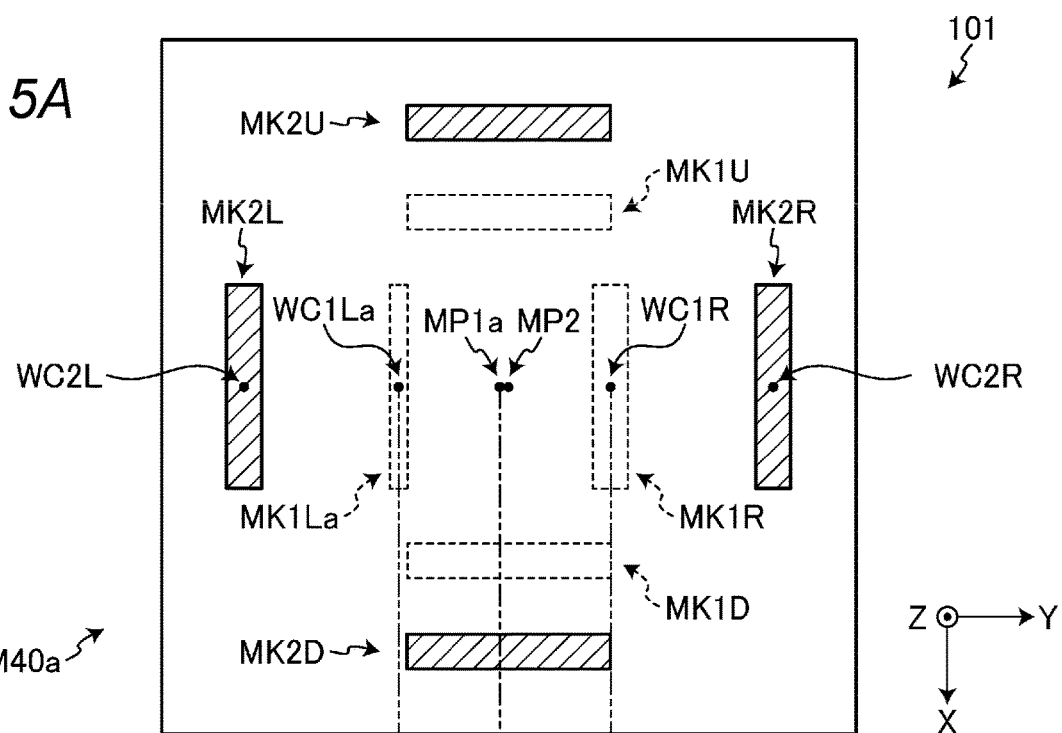
FIGS. 5A to 5C are plan and cross-sectional views illustrating a measurement mark measurement result according to the embodiment.
Figure 5B:
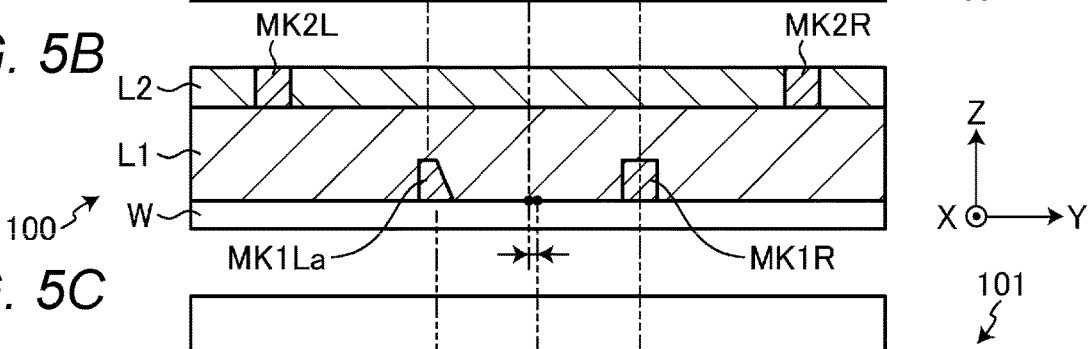

For example, it is assumed that the layer L1 including the superposition mark MK1 and the predetermined pattern PT1 (not illustrated) is formed on the substrate W and the layer L2 including the superposition mark MK2 and the predetermined pattern PT2 (not illustrated) is formed on the layer L1 as illustrated in FIG. 5B. The superposition mark MK1 includes superposition marks MK1La, MK1R, MK2L, and MK2R in the Y direction and superposition marks MK1U, MK1D, MK2U, and MK2D in the X direction. The superposition marks MK1La, MK1R, MK2L, and MK2R in the Y direction will be exemplified in the following description.

Of the superposition marks MK1La, MK1R, MK2L, and MK2R in the Y direction, the superposition marks MK1R, MK2L, and MK2R are uniform in the front surface shape on the +Z side and the front surface shape on the −Z side. Meanwhile, as for the superposition mark MK1La, the front surface shape on the +Z side is distorted as compared with the front surface shape on the −Z side and a Y-direction width is smaller than an appropriate width (see FIG. 4A).

Figure 5C:
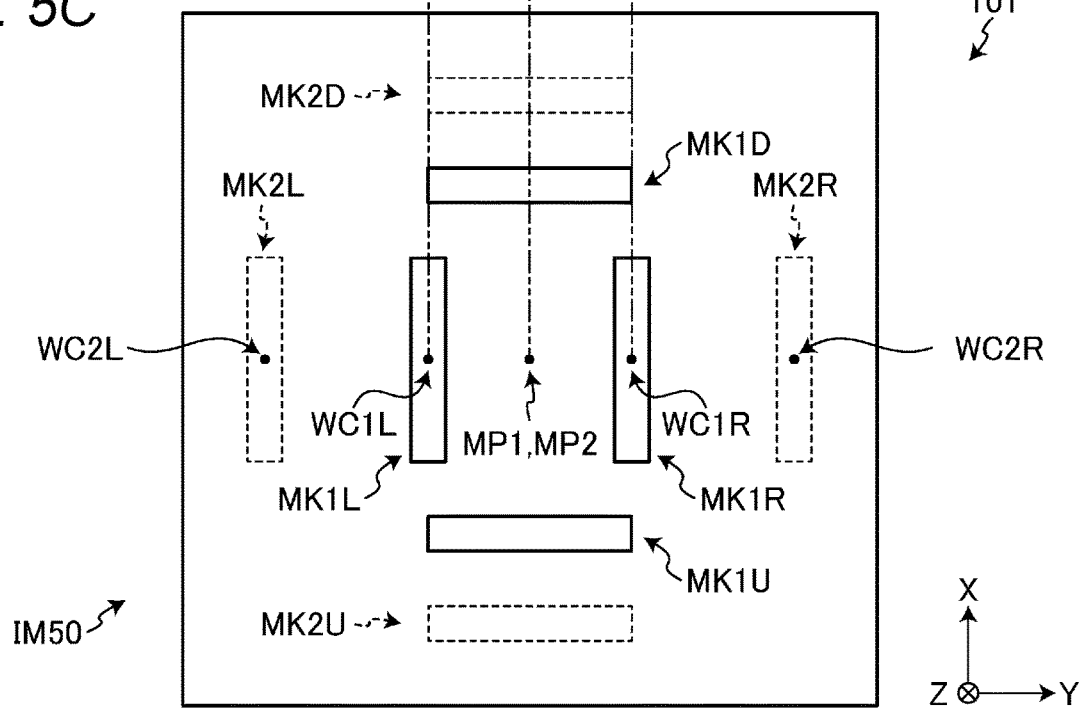

In this state, the measuring device 1 acquires images of the superposition marks MK1L, MK1R, MK2L, and MK2R. The controller 60 causes the sensor 40 to sense the front surface reflection images of the superposition marks MK1L, MK1R, MK2L, and MK2R by the light of the light source 20 to acquire image data IM40a of the front surface reflection images of the superposition marks MK1La, MK1R, MK2L, and MK2R as illustrated in FIG. 5A. The controller 60 causes the sensor 50 to sense the rear surface reflection images of the superposition marks MK1L, MK1R, MK2L, and MK2R by the light of the light source 30 to acquire the image data IM50 of the rear surface reflection images of the superposition marks MK1La, MK1R, MK2L, and MK2R as illustrated in FIG. 5C.

The controller 60 compares the image data IM40a of the front surface reflection image with the image data IM50 of the rear surface reflection image. As for the image data illustrated in FIGS. 5A to 5C, the controller 60 specifies that the superposition mark MK1La in the image data IM40a of the front surface reflection image is smaller in the Y-direction width than the superposition mark MK1L in the image data IM50 of the rear surface reflection image. As a result, the controller 60 determines that a degree of coincidence between the image data IM40a of the front surface reflection image and the image data IM50 of the rear surface reflection image is equal to or lower than a threshold value and the deviation between the front surface reflection image of the measurement mark and the rear surface reflection image of the measurement mark is out of the allowable range.

Returning to FIG. 3, when the deviation between the front surface reflection image of the measurement mark and the rear surface reflection image of the measurement mark is in the allowable range (No in S2), the measuring device 1 performs measurement using the front surface reflection image of the measurement mark (S3). In other words, the controller 60 performs measurement using the image data of the front surface reflection image of the measurement mark 101. The controller 60 analyzes the image data of the front surface reflection image of the measurement mark 101 to obtain a predetermined process evaluation amount according to the analysis result. When the measurement is misalignment measurement, the controller 60 analyzes the image data of the front surface reflection image of the measurement mark 101 to obtain an amount of inter-layer misalignment.

For example, in the image data IM40 of the front surface reflection image illustrated in FIG. 4A, the controller 60 compares a reference position of the layer L1 in accordance with the superposition marks MK1L and MK1R with a reference position of the layer L2 in accordance with the superposition marks MK2L and MK2R to obtain an amount of misalignment between the layers L1 and L2 according to the comparison result. The controller 60 obtains a midpoint MP1 of center-of-gravity positions WC1L and WC1R of the superposition mark MK1L and a superposition mark WL1R as the reference position of the layer L1 and obtains a midpoint MP2 of center-of-gravity positions WC2L and WC2R of the superposition mark MK2L and a superposition mark WL2R as the reference position of the layer L2. The controller 60 compares the reference position MP1 of the layer L1 with the reference position MP2 of the layer L2 to obtain an X-direction deviation between the two reference positions as an amount of X-direction misalignment between the layers L1 and L2. FIG. 4A illustrates a case where the reference position MP1 of the layer L1 and the reference position MP2 of the layer L2 coincide with each other and the misalignment amount is zero. As a result, misalignment measurement can be performed appropriately.

Returning to FIG. 3, when the deviation between the front surface reflection image of the measurement mark and the rear surface reflection image of the measurement mark is out of the allowable range (Yes in S2), the measuring device 1 performs measurement using the rear surface reflection image of the measurement mark (S4). In other words, the controller 60 performs measurement using the image data of the rear surface reflection image of the measurement mark 101. The controller 60 analyzes the image data of the rear surface reflection image of the measurement mark 101 to obtain a predetermined process evaluation amount according to the analysis result. When the measurement is misalignment measurement, the controller 60 analyzes the image data of the rear surface reflection image of the measurement mark 101 to obtain the amount of inter-layer misalignment.

In the image data IM50 of the rear surface reflection image illustrated in FIG. 5C, the controller 60 compares the reference position of the layer L1 in accordance with the superposition marks MK1L and MK1R with the reference position of the layer L2 in accordance with the superposition marks MK2L and MK2R to obtain the amount of misalignment between the layers L1 and L2 according to the comparison result. The controller 60 obtains the midpoint MP1 of the center-of-gravity positions WC1L and WC1R of the superposition marks MK1L and WL1R as the reference position of the layer L1 and obtains the midpoint MP2 of the center-of-gravity positions WC2L and WC2R of the superposition marks MK2L and WL2R as the reference position of the layer L2. The controller 60 compares the reference position MP1 of the layer L1 with the reference position MP2 of the layer L2 to obtain the X-direction deviation between the two reference positions as the amount of X-direction misalignment between the layers L1 and L2. FIG. 5C illustrates the case where the reference position MP1 of the layer L1 and the reference position MP2 of the layer L2 coincide with each other and the misalignment amount is zero.

For example, when measurement is performed using the image data IM40a of the front surface reflection image illustrated in FIG. 5A, it is assumed that a reference position MP1a of the layer L1 and the reference position MP2 of the layer L2 that are to match originally are deviated in the Y direction and the amount of misalignment between the layers L1 and L2 is obtained. The reference position MP1a may be a midpoint of center-of-gravity positions WC1La and WC1R of a superposition mark MK1La and a superposition mark MK1R.

To the contrary, in the present embodiment, measurement is performed using the image data IM50 of the rear surface reflection image illustrated in FIG. 5C, and thus the reference position MP1 of the layer L1 and the reference position MP2 of the layer L2 coincide with each other and the misalignment amount can be obtained as zero. As a result, misalignment measurement can be performed appropriately.

The measuring device 1 feeds back the measurement result obtained in S3 or S4 (for example, misalignment measurement result) to the next process (S5). The measuring device 1 may feedback the measurement result to the next process by transmitting measurement result data via a communication line to a device that performs the next process.

As described above, in the embodiment, the optical axis PA20 of the light source 20 in the front surface irradiation and the optical axis PA30 of the light source 30 in the rear surface irradiation coincide with each other in the measuring device 1. As a result, when an image of the measurement mark 101 in the measurement target 100 is acquired by both front surface irradiation and rear surface irradiation, axial alignment is easy between the optical axes PA20 and PA30 and the measurement target 100.

In addition, in the embodiment, in the measuring device 1, the front surface reflection image of the measurement mark 101 sensed by the sensor 40 and the rear surface reflection image of the measurement mark 101 sensed by the sensor 50 are compared and it is determined, according to the comparison result, which of the front surface reflection image of the measurement mark 101 and the rear surface reflection image of the measurement mark 101 is to be used in performing measurement. As a result, it is possible to perform measurement with an occurrence of measurement deception avoided, and thus measurement can be performed appropriately.

Figure 6:
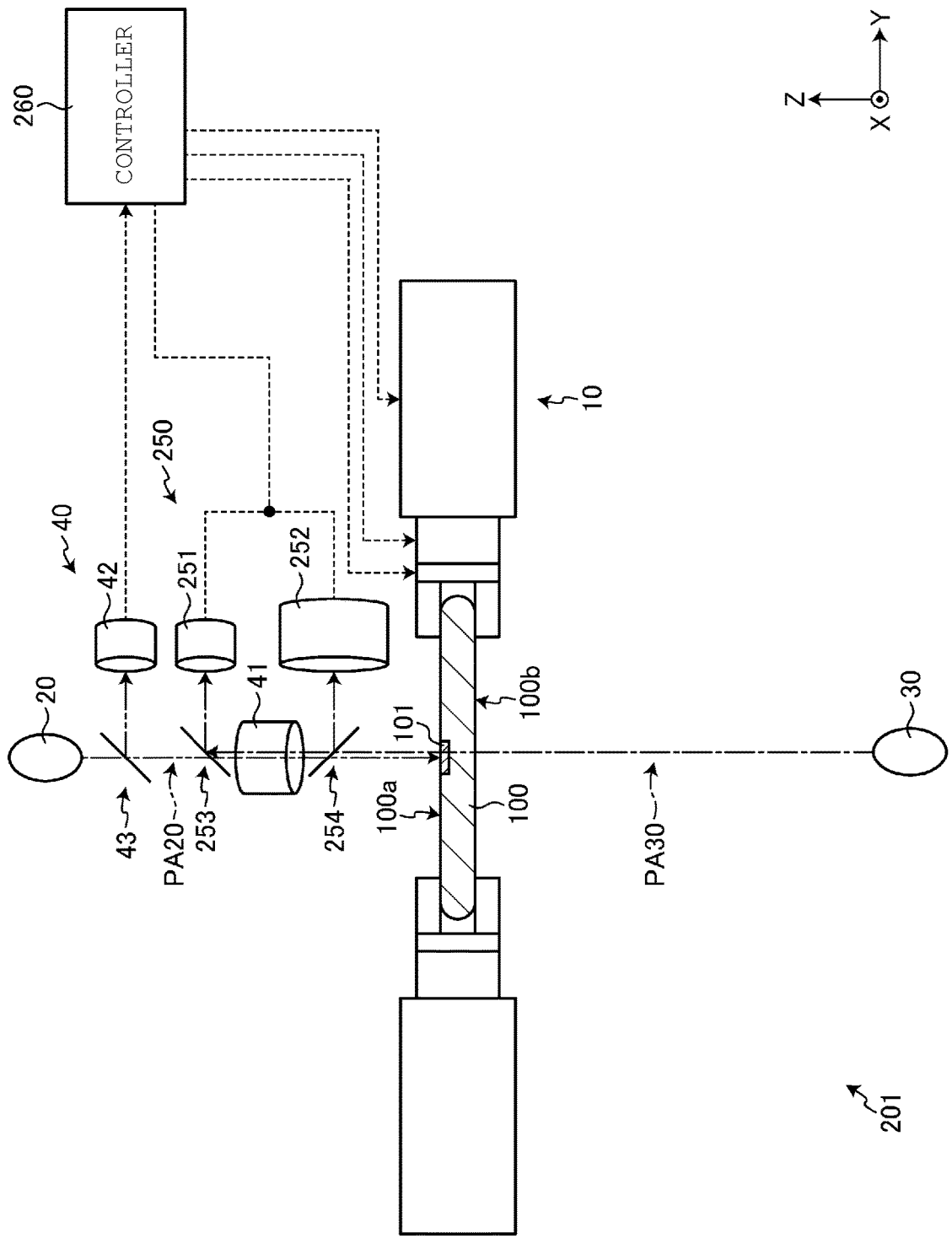
FIG. 6 is a diagram illustrating a configuration of a measuring device according to a first modification of the embodiment.

It is noted that as illustrated in FIG. 6, a measuring device 201 according to a first modification of the embodiment may be configured such that a rear surface transmission image of the measurement mark 101 can be acquired instead of the rear surface reflection image of the measurement mark 101. FIG. 6 illustrates a configuration of the measuring device 201 according to the first modification of the embodiment.

The measuring device 201 includes a sensor 250 instead of the sensor 50 (see FIG. 1). The sensor 250 senses a predetermined mark in the measurement target 100 (for example, the measurement mark 101 disposed on the front surface 100a) in accordance with the light from the light source 20. The sensor 250 is disposed on the front surface side of the support body 10 (+Z side). The sensor 250 is capable of acquiring the rear surface transmission image of the measurement mark 101 in the measurement target 100 from the +Z side.

The sensor 250 has a focus sensor 251, an imaging sensor 252, a half mirror 253, and a half mirror 254. The half mirror 253 is disposed at a position between the half mirror 43 and the optical system 41 on the optical axis PA20. The half mirror 254 is disposed at a position between the optical system 41 and the measurement target 100 on the optical axis PA20. The light from the light source 30 travels in the +Z direction along the optical axis PA30 and is transmitted through the measurement mark 101 of the measurement target 100, and the transmitted light travels in the +Z direction along the optical axis PA20. After passage through the half mirror 254 and the optical system 41, a part of the transmitted light is reflected in the Y direction by the half mirror 253 and incident on the focus sensor 251, and the other part is transmitted through the half mirror 253. The focus sensor 251 is coupled to the imaging sensor 252. The focus sensor 251 performs focus measurement according to the incident light, obtains a defocus amount of the imaging sensor 252, and supplies the defocus amount to a controller 260. The controller 260 moves the imaging sensor 252 in the Y direction according to the defocus amount and adjusts the focus of the imaging sensor 252.

A part of the reflected light transmitted through the half mirror 253 is reflected in the Y direction by the half mirror 254 and incident on the imaging sensor 252. The imaging sensor 252 acquires an image signal of the rear surface transmission image of the measurement mark 101 and supplies the image signal to the controller 260. As a result, the controller 260 generates the image data of the rear surface reflection image of the measurement mark 101 according to the image signal.

In this case, in the measuring device 1, the front surface reflection image of the measurement mark 101 sensed by the sensor 40 and the rear surface transmission image of the measurement mark 101 sensed by the sensor 250 are compared and it is determined, according to the comparison result, which of the front surface reflection image of the measurement mark 101 and the rear surface transmission image of the measurement mark 101 is to be used in performing measurement.

With such a configuration as well, it is possible to perform measurement with the occurrence of measurement deception avoided, and thus measurement can be performed appropriately.

Figure 7:
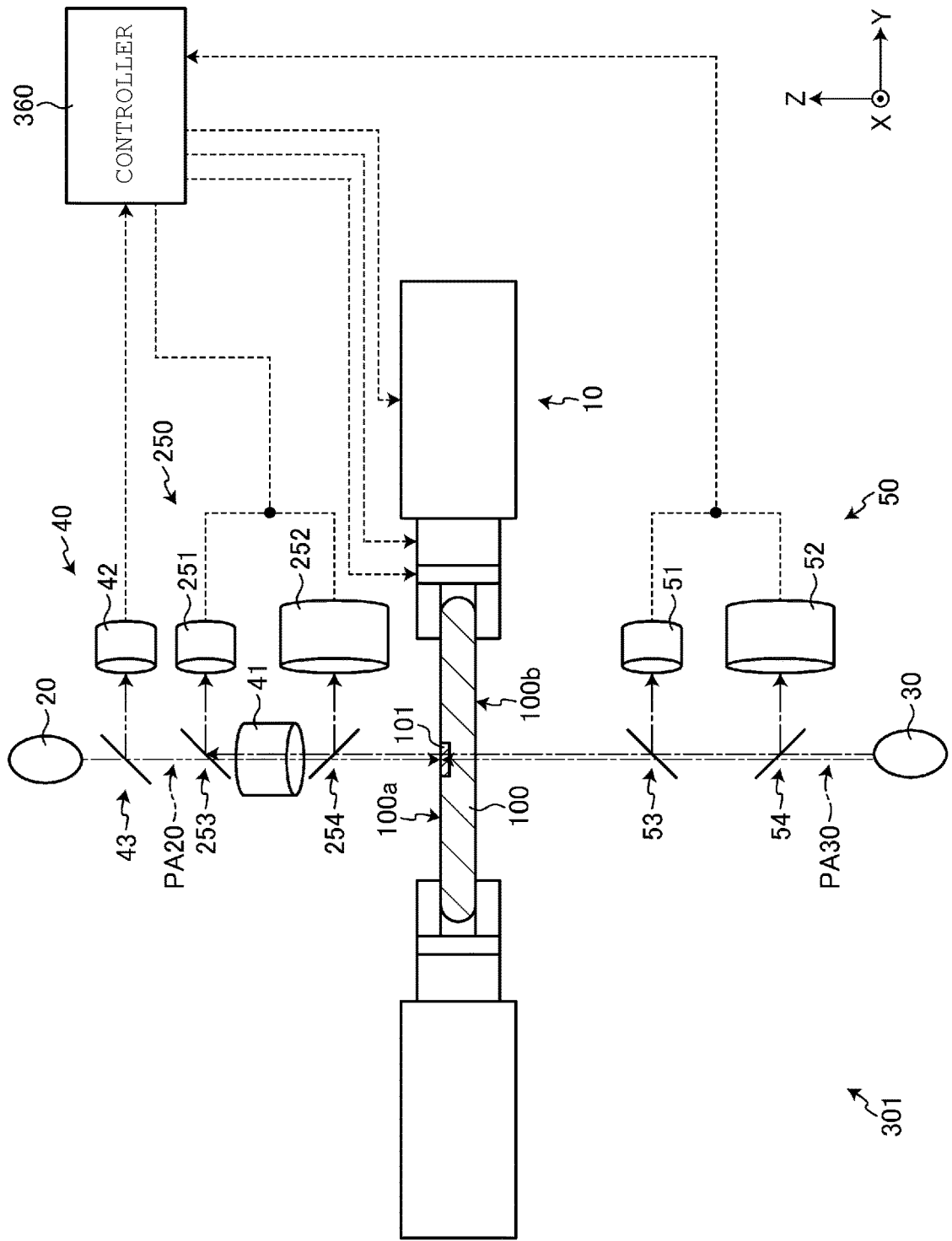
FIG. 7 is a diagram illustrating a configuration of a measuring device according to a second modification of the embodiment.

Alternatively, as illustrated in FIG. 7, a measuring device 301 according to a second modification of the embodiment may be a combination of the embodiment and the first modification. For example, the measuring device 301 includes a controller 360 which may be a combination of the controller 60 and the controller 260. FIG. 7 illustrates a configuration of the measuring device 301 according to the second modification of the embodiment.

The measuring device 301 includes the sensor 250 in addition to the sensor 50. The sensor 50 is disposed on the rear surface side of the support body 10 (−Z side), and the sensor 250 is disposed on the front surface side of the support body 10 (+Z side). The sensor 50 is capable of acquiring the rear surface reflection image of the measurement mark 101 in the measurement target 100 from the −Z side, and the sensor 250 is capable of acquiring the rear surface transmission image of the measurement mark 101 in the measurement target 100 from the +Z side. A configuration and an operation of the sensor 50 are the same as those of the embodiment, and a configuration and an operation of the sensor 250 are the same as those of the first modification of the embodiment.

In this case, in the measuring device 301, the front surface reflection image of the measurement mark 101 sensed by the sensor 40, the rear surface reflection image of the measurement mark 101 sensed by the sensor 50, and the rear surface transmission image of the measurement mark 101 sensed by the sensor 250 are compared and it is determined, according to the comparison result, which of the front surface reflection image of the measurement mark 101, the rear surface reflection image of the measurement mark 101, and the rear surface transmission image of the measurement mark 101 is to be used in performing measurement.

With such a configuration as well, it is possible to perform measurement with the occurrence of measurement deception avoided, and thus measurement can be performed appropriately.

Figure 8:
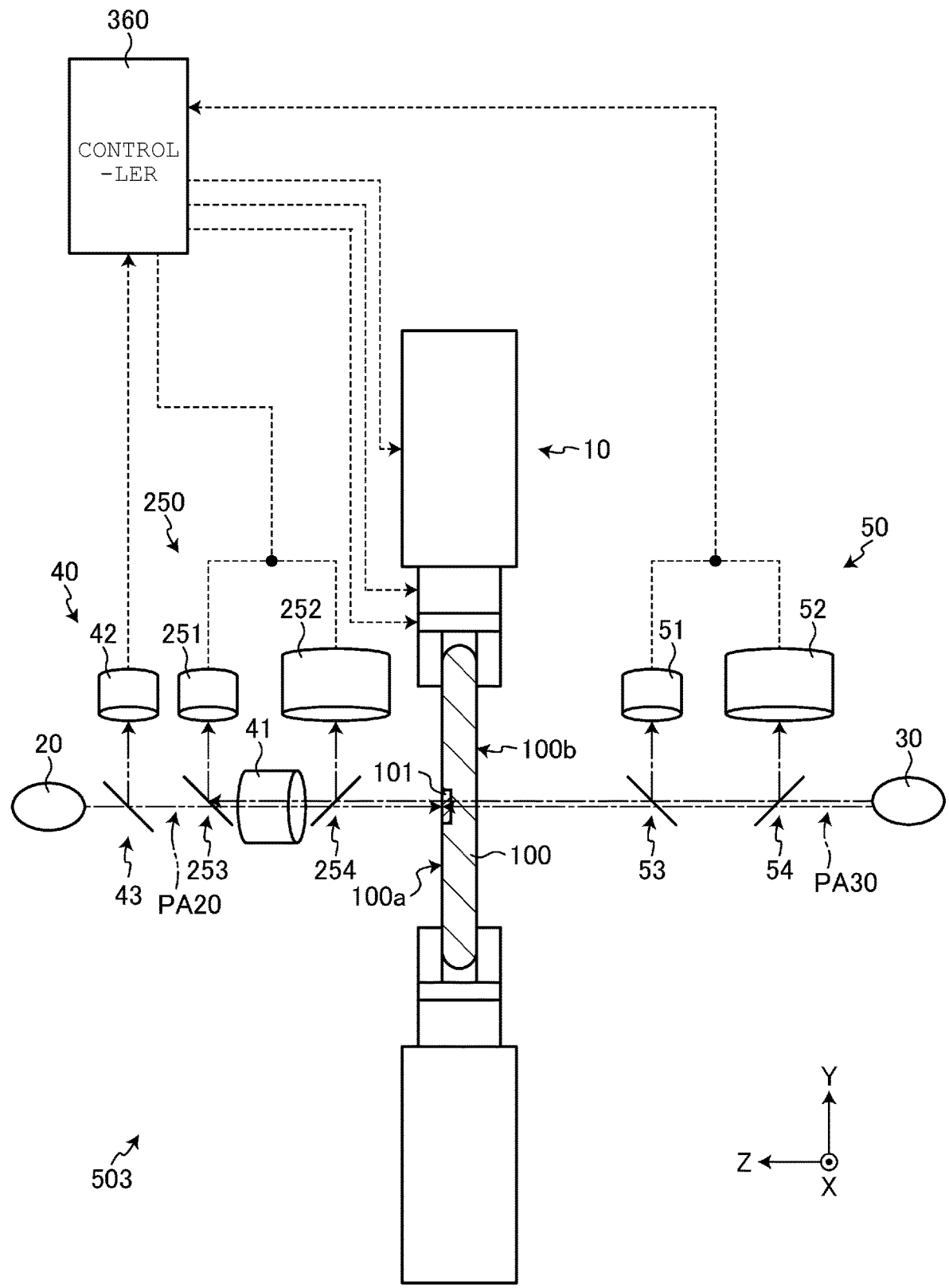
FIG. 8 is a diagram illustrating a configuration of a measuring device according to a third modification of the embodiment.

Alternatively, as illustrated in FIG. 8, a measuring device 503 according to a third modification of the embodiment may be configured such that the Z direction along the optical axis PA20 and the optical axis PA30 is along the horizontal direction. FIG. 8 illustrates a configuration of the measuring device 301 according to the third modification of the embodiment.

For example, the Y direction may be along the vertical direction, and the XZ directions may be along the horizontal direction. The measuring device 503 is capable of supporting the measurement target 100 in a posture in which the front surface 100a is along the vertical direction. As a result, it is possible to prevent the measurement target 100 from being affected by gravity and bent when supported by the support body 10, and the measurement target 100 can be stably supported.

Figure 9:
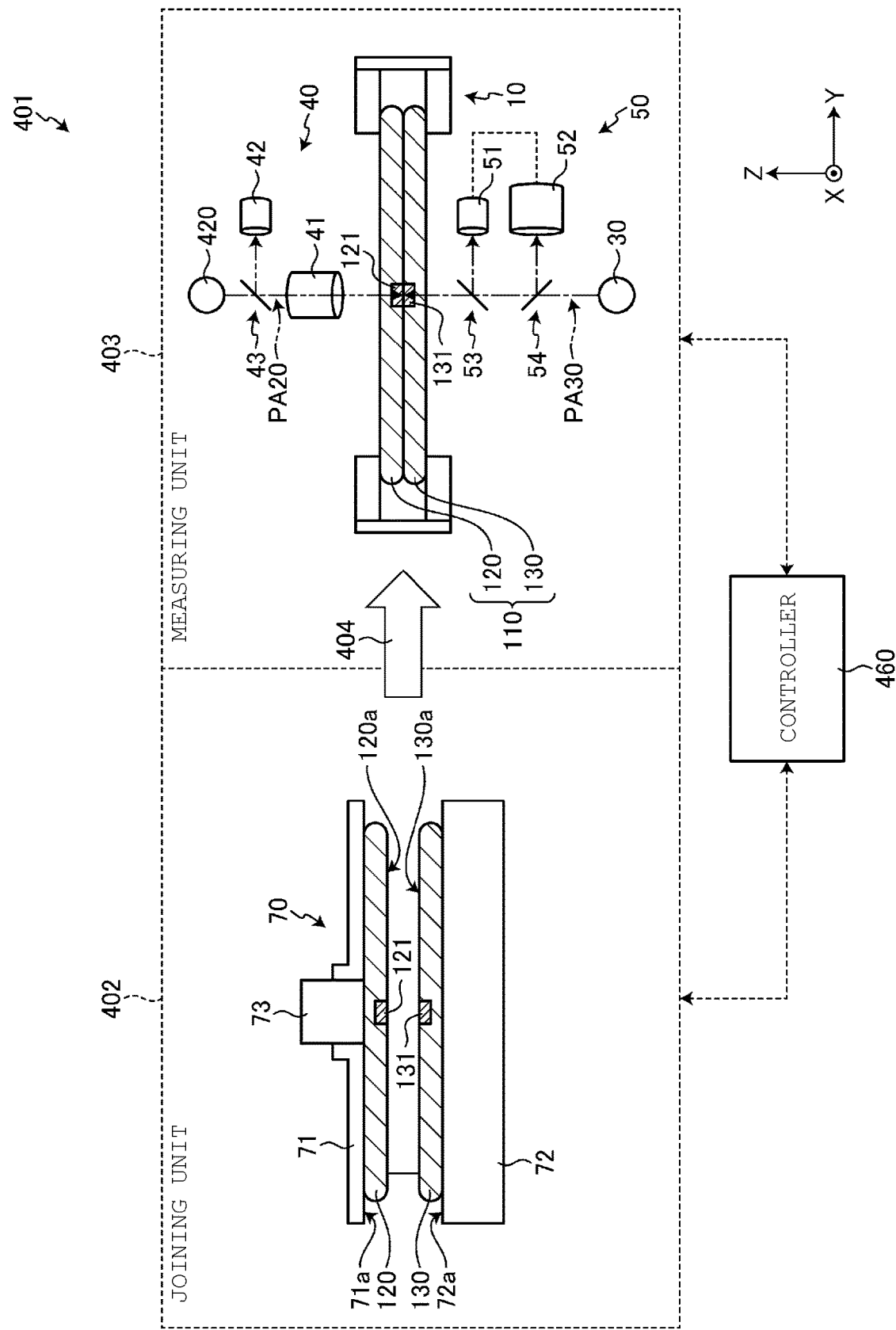
FIG. 9 is a diagram illustrating a schematic configuration of a measuring device according to a fourth modification of the embodiment.

Alternatively, as illustrated in FIG. 9, a measuring device 401 according to a fourth modification of the embodiment may be a device used for joining deviation measurement when a substrate is joined. FIG. 9 illustrates a schematic configuration of the measuring device 401 according to the fourth modification of the embodiment.

A stacked substrate 110 may be a measurement target by the measuring device 401. Substrates 120 and 130 are stacked in the stacked substrate 110. The measuring device 401 includes a joining unit 402, a measuring unit 403, a conveyance unit, and a controller 460. The measuring unit 403 has the same configuration as the measuring device 1 of the embodiment except that a light source 420 is provided instead of the light source 20 (see FIG. 1). Light emitted by the light source 420 is transmissive with respect to the measurement target. For example, when the measurement target is formed of a semiconductor (for example, silicon), the light of the light source 420 may be infrared light or light with a wavelength band of 1,000 nm or more. The light source 420 is any light source capable of generating infrared light and may be an infrared lamp, an infrared light emission diode (LED), an infrared laser diode (LD), or the like.

The joining unit 402 (70) joins a front surface 120a of the substrate 120 and a front surface 130a of the substrate 130 to generate the stacked substrate 110. The joining unit 402 has an adsorption stage 71, an adsorption stage 72, and a pressing member 73.

The adsorption stage 71 and the adsorption stage 72 face each other in the Z direction when used. The adsorption stage 71 is capable of adsorbing the substrate 120 on a main surface 71a facing the adsorption stage 72. The adsorption stage 72 is capable of adsorbing the substrate 130 on a main surface 72a facing the adsorption stage 71. A measurement mark 121 is formed on the front surface 120a of the substrate 120. A measurement mark 131 is formed on the front surface 130a of the substrate 130. The front surface 120a of the substrate 120 and the front surface 130a of the substrate 130 may be activated in advance by inter-plug treatment or the like. The controller 460 locates the adsorption stage 71 and the adsorption stage 72 in the XY directions. At this time, the controller 460 may locate the adsorption stage 71 and the adsorption stage 72 such that the XY positions of the measurement mark 121 and the measurement mark 131 match. Subsequently, the controller 460 controls the pressing member 73 to push the front surface 120a of the substrate 120 to the −Z side. The controller 460 joins the substrate 120 and the substrate 130 by bringing the substrate 120 into contact with the substrate 130 while deforming the substrate 120 such that a vicinity of a middle portion of the substrate 120 protrudes to a substrate 130 side. When the joining of the substrate 120 and the substrate 130 is completed, the controller 460 retracts the pressing member 73 to the +Z side, releases the adsorption of the substrate 120 by the adsorption stage 71, and retracts the adsorption stage 71 to the +Z side as well. As a result, the stacked substrate 110 in which the substrates 120 and 130 are stacked is obtained. The controller 460 controls the conveyance unit 404 to convey the stacked substrate 110 from the joining unit 402 to the measuring unit 403.

Figure 10:
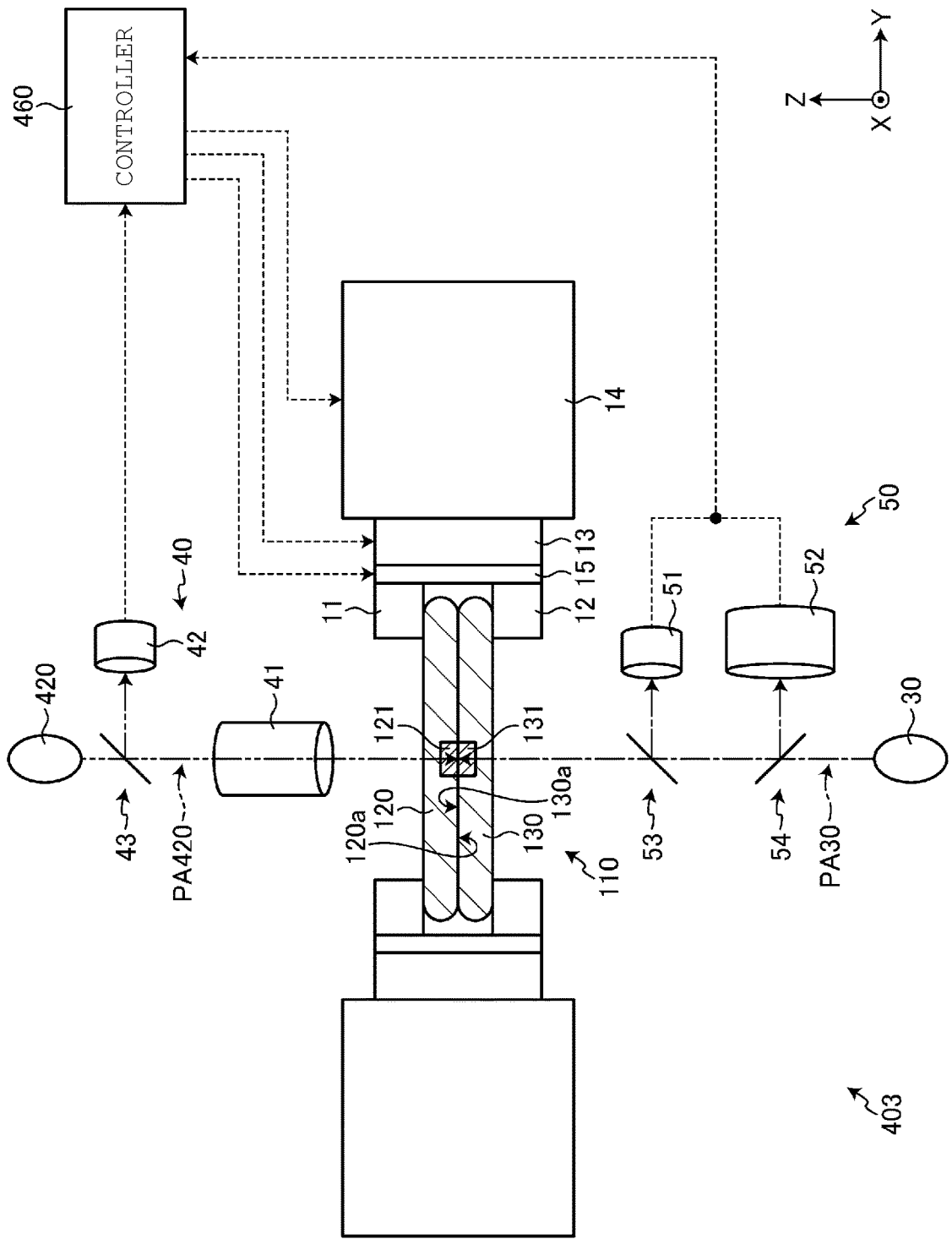
FIG. 10 is a diagram illustrating a configuration of a measuring unit in the fourth modification of the embodiment.

When the stacked substrate 110 is conveyed, the controller 460 controls the support body 10 and causes the grip portion 11 and the grip portion 12 to grip an end portion of the stacked substrate 110 as in the embodiment. In other words, as illustrated in FIG. 10, the controller 460 controls the support body 10 to move the stacked substrate 110 in the XY directions and the rotation direction around the Z axis via the grip portion 11 and the grip portion 12 and locate an optical axis PA420 of the light source 420 with the measurement mark 121 of the substrate 120 in the stacked substrate 110. Since the optical axis PA20 of the light source 20 and the optical axis PA30 of the light source 30 coincide with each other, axial alignment is easy between the optical axes PA420 and PA30 and the stacked substrate 110. By aligning the optical axis PA420 of the light source 420 with the measurement mark 121 in the stacked substrate 110, the optical axis PA30 of the light source 30 can be aligned with the measurement mark 131 in the stacked substrate 110. In this state, the controller 460 causes the measurement marks 121 and 131 to be irradiated with light (for example, infrared light) from the light source 420 from the +Z side, causes the sensor 40 to sense a rear surface reflection image reflected by the measurement mark 121 and a front surface reflection image reflected by the measurement mark 131, and acquires image data of the rear surface reflection image of the measurement mark 121 and the front surface reflection image of the measurement mark 131.

At this time, the controller 460 may control the sensor 40 and the sensor 50 such that an operation of the sensor 40 sensing the measurement mark 121, an operation of the sensor 40 sensing the measurement mark 131, an operation of the sensor 50 sensing the measurement mark 121, and the operation of the sensor 50 sensing the measurement mark 131 are performed in parallel.

The controller 460 causes the measurement marks 121 and 131 to be irradiated with light (for example, infrared light) from the light source 30 from the −Z side, causes the sensor 40 to sense the front surface reflection image reflected by the measurement mark 121 and the rear surface reflection image reflected by the measurement mark 131, and acquires the image data of the front surface reflection image of the measurement mark 121 and the image data of the rear surface reflection image of the measurement mark 131.

The measuring device 401 makes the same determination as in S2 of FIG. 3 for each of the measurement marks 121 and 131. When the deviation between the front surface reflection image and the rear surface reflection image of the measurement mark is in the allowable range in both the measurement marks 121 and 131 (No in S2), the measuring device 401 performs joining deviation measurement with the respective front surface reflection images of the measurement marks 121 and 131 (S3).

When the deviation between the front surface reflection image and the rear surface reflection image of the measurement mark 121 is in the allowable range (No in S2) and the deviation between the front surface reflection image and the rear surface reflection image of the measurement mark 131 is out of the allowable range (Yes in S2), the measuring device 401 performs joining deviation measurement with the front surface reflection image of the measurement mark 121 (S3) and performs joining deviation measurement with the rear surface reflection image of the measurement mark 131 (S4).

When the deviation between the front surface reflection image and the rear surface reflection image of the measurement mark 121 is out of the allowable range (Yes in S2) and the deviation between the front surface reflection image and the rear surface reflection image of the measurement mark 131 is in the allowable range (No in S2), the measuring device 401 performs joining deviation measurement with the rear surface reflection image of the measurement mark 121 (S4) and performs joining deviation measurement with the front surface reflection image of the measurement mark 131 (S3).

When the deviation between the front surface reflection image and the rear surface reflection image of the measurement mark is out of the allowable range in both the measurement marks 121 and 131 (Yes in S2), the measuring device 401 performs joining deviation measurement with the respective rear surface reflection images of the measurement marks 121 and 131 (S4).

The measuring device 401 feeds back the joining deviation measurement result obtained in S3 and/or S4 to the next joining process by the joining unit 402 (S5).

As described above, when the measurement target is the stacked substrate 110, the image of the measurement mark sensed by the sensor 40 and the image of the measurement mark sensed by the sensor 50 are compared with regard to each of the measurement mark 121 of the substrate 120 and the measurement mark 131 of the substrate 130 and it is determined, according to the comparison result, which of the front surface reflection image of the measurement mark and the rear surface reflection image of the measurement mark is to be used in performing measurement. As a result of this as well, it is possible to perform measurement with the occurrence of measurement deception avoided, and thus measurement can be performed appropriately.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A measuring device comprising:
a support body configured to support an end portion of a measurement target;
a first light source disposed on a front surface side of the support body;
a second light source disposed on a rear surface side of the support body and having an optical axis coinciding with an optical axis of the first light source;
a first sensor configured to acquire an image of a mark in the measurement target in accordance with light from the first light source;
a second sensor configured to acquire an image of the mark in the measurement target in accordance with light from the second light source; and
a controller comparing a sensing result of the first sensor with a sensing result of the second sensor and determining, according to a result of the comparing, which of the sensing result of the first sensor or the sensing result of the second sensor is to be used in performing a measurement.

2. The measuring device according to claim 1, wherein
the first sensor is disposed on the front surface side of the support body and is configured to acquire a reflection image of the measurement target, and
the second sensor is disposed on the rear surface side of the support body and is configured to acquire a reflection image of the measurement target.

3. The measuring device according to claim 1, wherein
the first sensor is disposed on the front surface side of the support body and is configured to acquire a reflection image of the measurement target, and
the second sensor is disposed on the front surface side of the support body and is configured to acquire a transmission image of the measurement target.

4. The measuring device according to claim 1, wherein
the first light source emits a visible light, and the second light source emits an infrared light.

5. The measuring device according to claim 1, wherein the first light source emits an infrared light, and the second light source emits an infrared light.

6. The measuring device according to claim 1, wherein the measurement target is a substrate, and the mark is a first measurement mark disposed on a front surface of the substrate.

7. The measuring device according to claim 6, wherein an operation of the first sensor sensing the first measurement mark and an operation of the second sensor sensing the first measurement mark are performed in parallel.

8. The measuring device according to claim 1, wherein the measurement target is a stacked substrate in which a front surface of a first substrate and a front surface of a second substrate are joined, the mark is a first measurement mark disposed on the front surface of the first substrate, and each of the first sensor and the second sensor senses the first measurement mark disposed on the front surface of the first substrate and a second measurement mark disposed on the front surface of the second substrate.

9. The measuring device according to claim 8, wherein an operation of the first sensor sensing the first measurement mark, an operation of the first sensor sensing the second measurement mark, an operation of the second sensor sensing the first measurement mark, and an operation of the second sensor sensing the second measurement mark are performed in parallel.

10. The measuring device according to claim 1, wherein the controller determines that measurement is to be performed using the first sensor when a difference between the sensing result of the first sensor and the sensing result of the second sensor is equal to or less than a threshold value, and determines that measurement is to be performed using the sensing result of the second sensor when the difference between the sensing result of the first sensor and the sensing result of the second sensor exceeds the threshold value.

11. A measuring method comprising:
irradiating a measurement target with light from a first light source disposed on a front surface side of a support body and irradiating the measurement target with light from a second light source disposed on a rear surface side of the support body, the second light source having an optical axis coinciding with an optical axis of the first light source in a state where the support body supports an end portion of the measurement target having a front surface on which a first measurement mark is disposed;
acquiring an image in accordance with light from the first light source with a first sensor and acquiring an image in accordance with the light from the second light source with a second sensor;
comparing a sensing result of the first sensor with a sensing result of the second sensor; and
determining, according to a result of the comparing, which of the sensing result of the first sensor or the sensing result of the second sensor is to be used in performing a measurement.

12. The measuring method according to claim 11, wherein the first light source emits a visible light, and the second light source emits an infrared light.

13. The measuring method according to claim 11, wherein the first light source emits an infrared light, and the second light source emits an infrared light.

14. The measuring method according to claim 11, wherein the measurement target is a substrate.

15. The measuring method according to claim 14, further comprising:
performing an operation of the first sensor sensing the first measurement mark and an operation of the second sensor sensing the first measurement mark, in parallel.

16. The measuring method according to claim 11, wherein the measurement target is a stacked substrate in which a front surface of a first substrate and a front surface of a second substrate are joined, the first measurement mark is disposed on the front surface of the first substrate, and each of the first sensor and the second sensor senses the first measurement mark disposed on the front surface of the first substrate and a second measurement mark disposed on the front surface of the second substrate.

17. The measuring method according to claim 16, further comprising:
performing an operation of the first sensor sensing the first measurement mark, an operation of the first sensor sensing the second measurement mark, an operation of the second sensor sensing the first measurement mark, and an operation of the second sensor sensing the second measurement mark, in parallel.

18. The measuring method according to claim 11, further comprising:
determining that the measurement is to be performed using the first sensor when a difference between the sensing result of the first sensor and the sensing result of the second sensor is equal to or less than a threshold value.

19. The measuring method according to claim 11, further comprising: determining that the measurement is to be performed using the sensing result of the second sensor when a difference between the sensing result of the first sensor and the sensing result of the second sensor exceeds a threshold value.

* * * * *